United States Patent
So et al.

(10) Patent No.: US 8,592,801 B2
(45) Date of Patent: Nov. 26, 2013

(54) UP-CONVERSION DEVICE WITH BROAD BAND ABSORBER

(75) Inventors: Franky So, Gainesville, FL (US); Do Young Kim, Gainesville, FL (US); Bhabendra Pradhan, Marietta, GA (US); Jae Woong Lee, Gainesville, FL (US)

(73) Assignees: University of Florida Research Foundation, Inc., Gainesville, FL (US); Nanoholdings, LLC, Rowayton, CT (US)

( * ) Notice: Subject to any disclaimer, the term of this patent is extended or adjusted under 35 U.S.C. 154(b) by 84 days.

(21) Appl. No.: 13/272,928

(22) Filed: Oct. 13, 2011

(65) Prior Publication Data

US 2012/0217477 A1 Aug. 30, 2012

Related U.S. Application Data

(60) Provisional application No. 61/447,427, filed on Feb. 28, 2011.

(51) Int. Cl.
*H01L 31/00* (2006.01)
*H01L 29/08* (2006.01)
*H01L 33/00* (2010.01)

(52) U.S. Cl.
USPC ................................. 257/21; 257/40; 257/80

(58) Field of Classification Search
USPC ............................................. 257/21, 40, 80
See application file for complete search history.

(56) References Cited

U.S. PATENT DOCUMENTS

| 5,122,905 | A * | 6/1992 | Wheatley et al. | 359/586 |
| 2005/0236556 | A1* | 10/2005 | Sargent et al. | 250/214.1 |
| 2006/0290270 | A1* | 12/2006 | Kim et al. | 313/503 |
| 2009/0208776 | A1* | 8/2009 | Liu et al. | 428/690 |
| 2009/0223566 | A1* | 9/2009 | Mitsui et al. | 136/263 |
| 2010/0025662 | A1* | 2/2010 | Cho et al. | 257/40 |
| 2010/0181552 | A1* | 7/2010 | So | 257/21 |
| 2012/0241723 | A1* | 9/2012 | Klem et al. | 257/21 |

OTHER PUBLICATIONS

Konstantatos, G. et al., "Solution-Processed Quantum Dot Photodetectors," *Proceedings of the IEEE*, Oct. 2009, pp. 1666-1683, vol. 97, No. 10.

Xie, R. et al., "InAs/InP/ZnSe Core/Shell/Shell Quantum Dots as Near-Infrared Emitters: Bright, Narrow-Band, Non-Cadmium Containing, and Biocompatible," *Nano Res*, 2008, pp. 457-464, vol. 1.

* cited by examiner

*Primary Examiner* — Ha Tran T Nguyen
*Assistant Examiner* — Dzung Tran
(74) *Attorney, Agent, or Firm* — Wolf, Greenfield & Sacks, P.C.

(57) ABSTRACT

Embodiments of the invention are directed to an IR photodetector that broadly absorbs electromagnetic radiation including at least a portion of the near infrared (NIR) spectrum. The IR photodetector comprises polydispersed QDs of PbS and/or PbSe. The IR photodetector can be included as a layer in an up-conversion device when coupled to a light emitting diode (LED) according to an embodiment of the invention.

15 Claims, 5 Drawing Sheets

UP-CONVERSION DEVICE WITH BROAD BAND ABSORBER

CROSS-REFERENCE TO RELATED APPLICATION

The present application claims the benefit of U.S. Provisional Application Ser. No. 61/447,427, filed Feb. 28, 2011, which is hereby incorporated by reference herein in its entirety, including any figures, tables, or drawings.

BACKGROUND OF INVENTION

Recently, light up-conversion devices have attracted a great deal of research interest because of their potential applications in night vision, range finding, and security, as well as semiconductor wafer inspections. Early near infrared (NIR) up-conversion devices were mostly based on the heterojunction structure of inorganic semiconductors where a photodetecting and a luminescent section are in series. The up-conversion devices are mainly distinguished by the method of photodetection. Up-conversion efficiencies of devices are typically very low. For example, one NIR-to-visible light up-conversion device that integrates a light-emitting diode (LED) with a semiconductor based photodetector exhibits a maximum external conversion efficiency of only 0.048 (4.8%) W/W. A hybrid organic/inorganic up-conversion device, where an InGaAs/InP photodetector is coupled to an organic light-emitting diode (OLED), exhibits an external conversion efficiency of 0.7% W/W. Currently inorganic and hybrid up-conversion devices are expensive to fabricate and the processes used for fabricating these devices are not compatible with large area applications. Efforts are being made to achieve low cost up-conversion devices that have higher conversion efficiencies, although no device has been identified that allows sufficient efficiency to be considered a practical up-conversion device. For some applications, such as night vision devices, up-conversion devices having an IR sensitizing layer with a broad absorption spectrum is very desirable.

BRIEF SUMMARY

Embodiments of the invention are directed to an IR photodetector comprising a cathode, an anode, and an IR sensitizing layer, comprising polydispersed quantum dots (QDs), that absorbs over a broad range, including at least a portion of the near infrared (NIR). The QD layer comprises polydispersed PbS QDs and/or polydispersed PbSe QDs that comprise either a polymodal mixture of different sized monodispersed QDs, a monomodal polydispersed QD mixture, or a polymodal polydispersed QD mixture. The polydispersed quantum dots (QDs) can be synthesized directly or prepared by mixing a plurality of different sized QDs. The IR photodetector can include a hole blocking layer (HBL) and/or an electron blocking layer (EBL).

In other embodiments of the invention, an up-conversion device is formed by the combination of the IR photodetector and a light emitting diode (LED). The LED comprises a light emitting layer and optionally an electron transport layer (ETL) and/or a hole transport layer (HTL).

DETAILED DISCLOSURE

Figure 1:
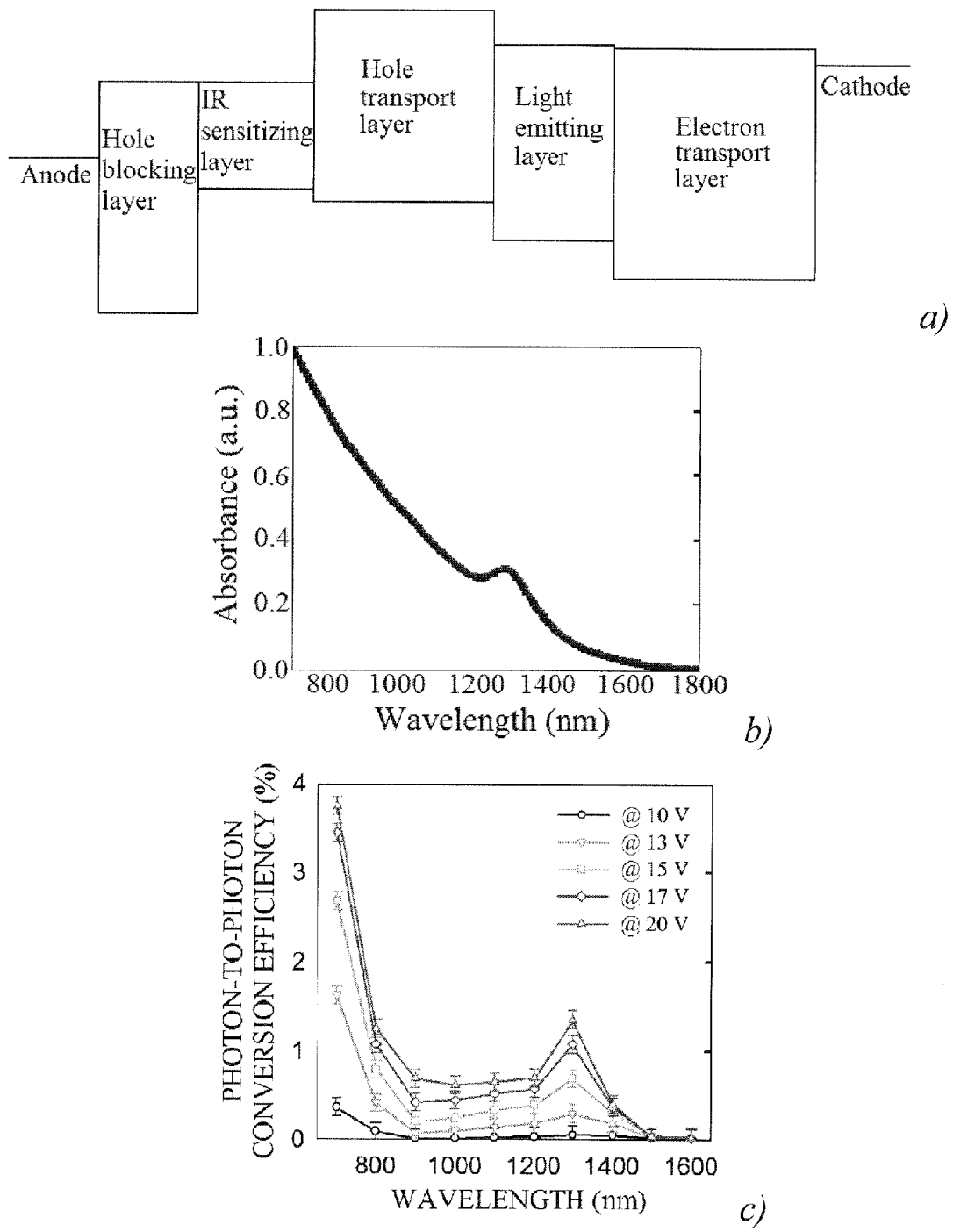
FIG. 1 shows a) a schematic energy band diagram of a prior art infrared-to-visible light up-conversion device with single absorption peak spectrum, b) an absorbance spectrum of an IR absorbing PbSe quantum dot (QD) film with monodispersed QDs, and c) a plot of the photon-to-photon conversion efficiency of the up-conversion device.

Embodiments of the invention are directed to devices having an infrared (IR) sensitizing layer having a broad absorption spectrum comprising polydispersed quantum dots (QDs). The IR sensitizing layer can be used in an IR photodetector that can be used in an IR up-conversion device, according to embodiments of the invention. FIG. 1a is a schematic diagram of a prior art up-conversion device having an IR sensitizing layer. The device uses a film of monodispersed PbSe quantum dots as the IR sensitizing layer with an absorption maximum of about 1300 nm, as can be seen in the spectrum shown in FIG. 1b, to provide the energy input for the photodetector. FIG. 1c shows the photon-to-photon conversion efficiency of the IR up-conversion device. The conversion efficiency spectrum of the up-conversion device reflects the absorbance spectrum of the PbSe quantum dot film.

Figure 2:
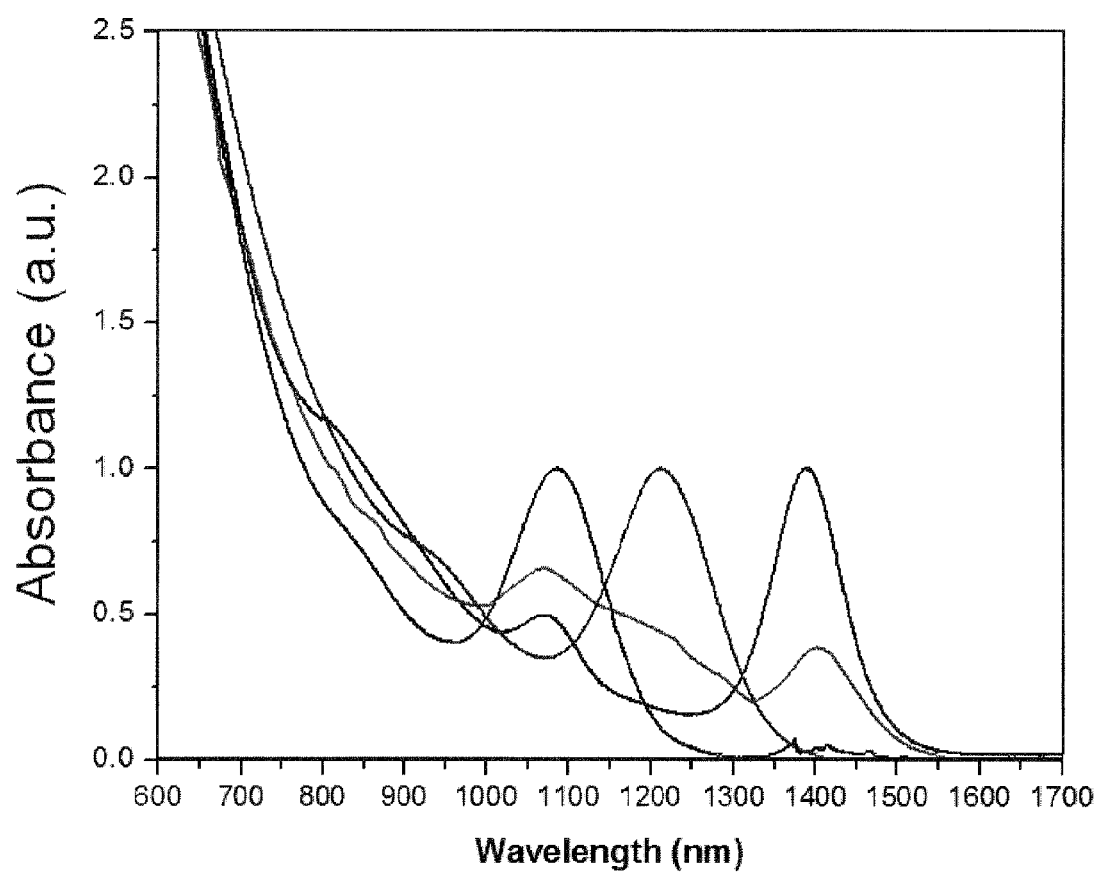
FIG. 2 shows composite of absorbance spectra for a PbSe quantum dot film having different sized monodispersed QDs.
Figure 3:
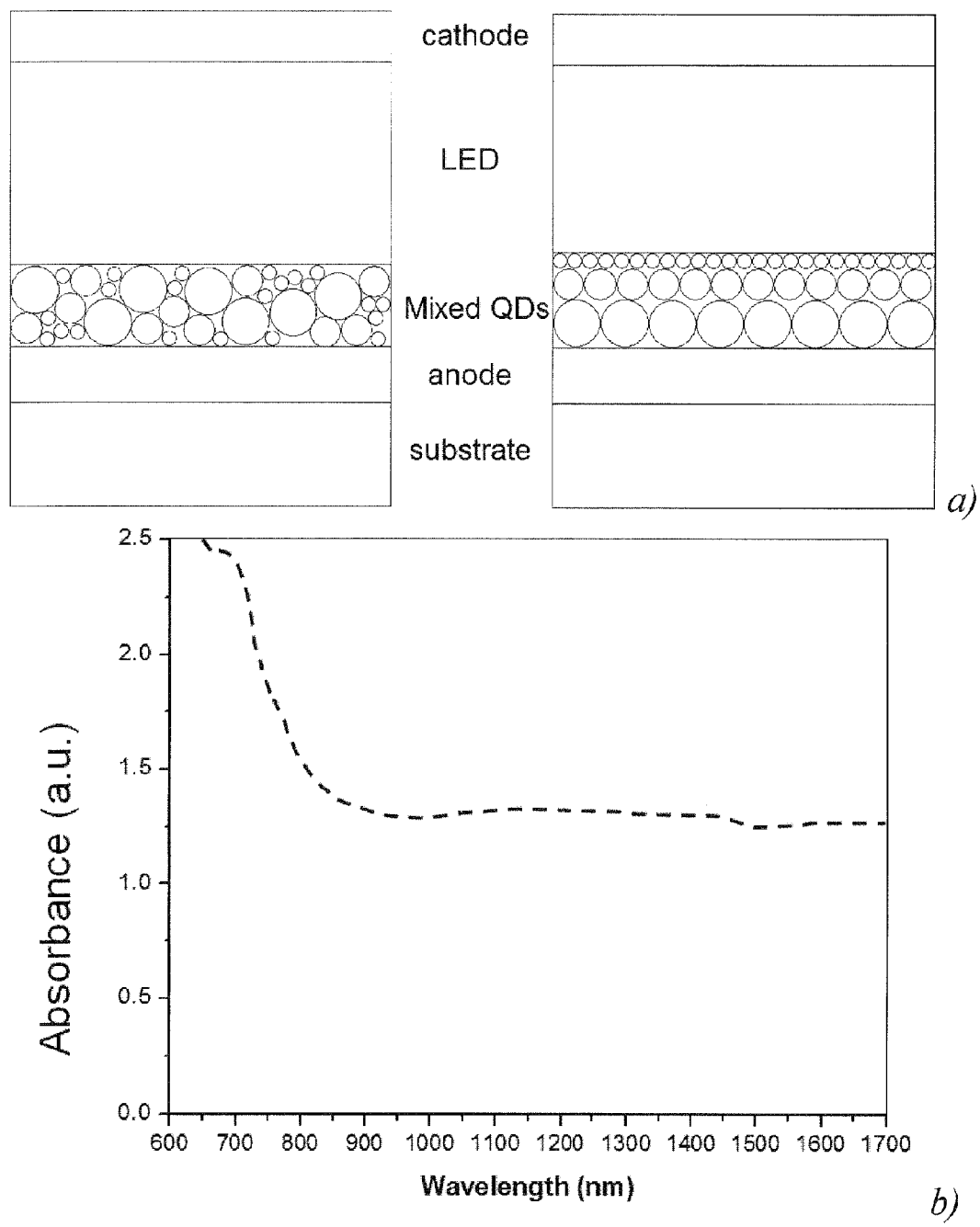
FIG. 3 shows a) an up-conversion device with an IR sensitizing layer of mixed QDs and b) the absorbance spectra of a polydispersed PbSe QD film that would result from the combination of the three monodispersed QDs of the films of FIG. 2.
Figure 4:
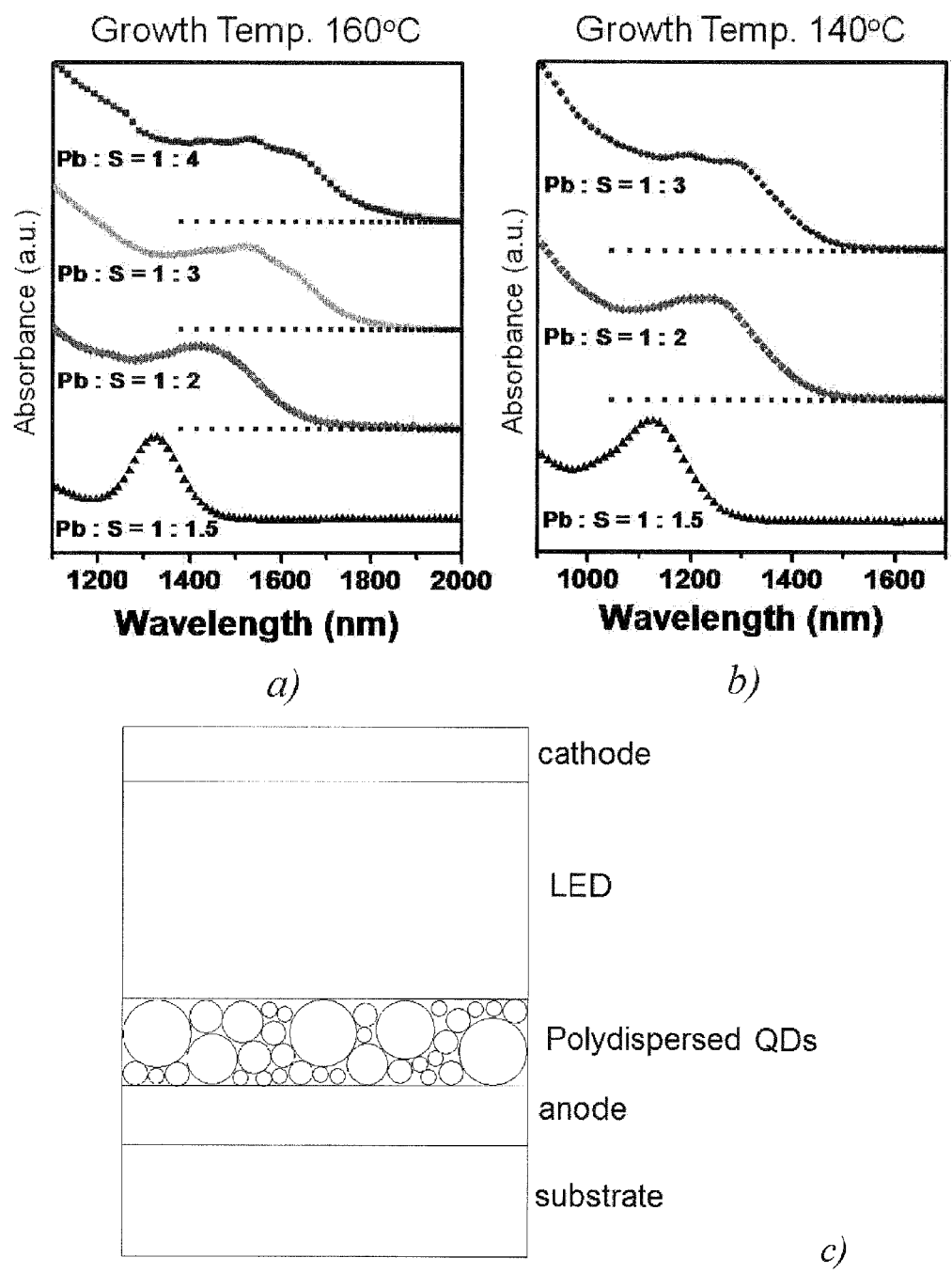
FIG. 4 shows absorption spectra for polydispersed PbS QDs prepared with different metal to calcogenide ratios at a) 160° C. and b) 140° C. and c) an up-conversion device with an IR sensitizing layer of polydispersed QDs according to an embodiment of the invention.

The absorption spectra of PbSe quantum dots depend on the size of PbSe quantum dots, as shown in FIG. 2, where the spectra of three different sized PbSe QDs are superimposed with their longest wavelength maximum normalized to one absorbance unit. According to an embodiment of the invention, an up-conversion device includes an IR photodetector that comprises a sensitizing layer of polydispersed PbSe QDs of different sizes and a light emitting diode (LED). As illustrated, for either up-conversion device in FIG. 3a, by having a polymodal combination of three monodispersed QDs of the different sizes, which individually display the absorbance spectra of FIG. 2, a combined absorbance spectrum results, as indicated in FIG. 3b. Rather than combining different available monodispersed QDs, a monomodal polydispersed QDs mixture can be synthesized. In this manner, many different sized QDs are present as a continuum of sizes rather than as a mixture of discrete sizes. FIGS. 4a and 4b show broad absorption spectra for films of polydispersed PbS QDs that could be included in an IR photosensitizing layer in an up-conversion device, for example, as illustrated in FIG. 4c. By controlling the molar proportions of the metal and calcogenide reagents and the reaction temperature, QDs with broad absorptions are possible. As shown in FIGS. 4a and 4b, PbS QDs with absorption maxima at 1320 nm and 1150 nm are formed at a Pb:S ratio of 1:1.5 at 160° C. and 140° C., respectively, while increasing the S ratio results in the formation of PbS QD with broader absorption spectra at 160° C. and 140° C., with the broadest spectrum observed for the QDs prepared at a Pb:S ratio of 1:4 at 160° C. These QDs absorb in a portion of the near IR (NIR) with absorbance extending into the visual. As can be appreciated by those skilled in the art, any monomodal mixture of polydispersed QDs, any mixture of polydispersed QDs with monodispersed QDs, any mixture of a plurality of different monodispersed QDs, or any polymodal mixture of polydispersed QDs can be prepared to provide a broad absorbing IR sensitizing layer according to embodiments of the invention.

Figure 5:
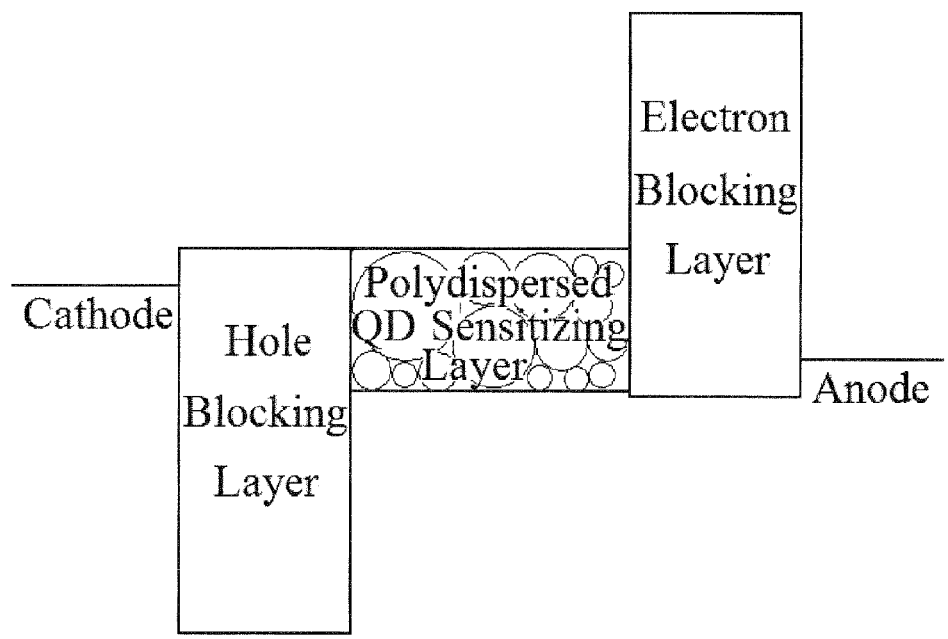
FIG. 5 shows a schematic energy band diagram of a photodetector comprising a broad absorption IR sensitizing layer comprising polydispersed QDs according to an embodiment of the invention.

FIG. 5 is the schematic energy band diagram of a photodetector comprising a broad absorption IR sensitizing layer, according to an embodiment of the invention. In FIG. 5, an optional electron blocking layer (EBL) and an optional hole blocking layer (HBL) are included in the photodetector. The broad absorption IR sensitizing layer can comprise mixed PbSe QDs or mixed PbS QDs. The optional HBL can be an organic HBL comprising, for example, 2,9-Dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, or tris[3-(3-pyridyl)-mesityl]borane (3TPYMB). The optional HBL can be an inorganic HBL, for example a HBL comprising ZnO or $TiO_2$. The optional EBL can be 1,1-bis[(di-4-tolylamino)phenyl]cyclohexane (TAPC), N,N'-diphenyl-N,N'(2-naphthyl)-(1,1'-phenyl)-4,4'-diamine (NPB), and N,N'-diphenyl-N,N'-di(m-tolyl) benzidine (TPD).

Figure 6:
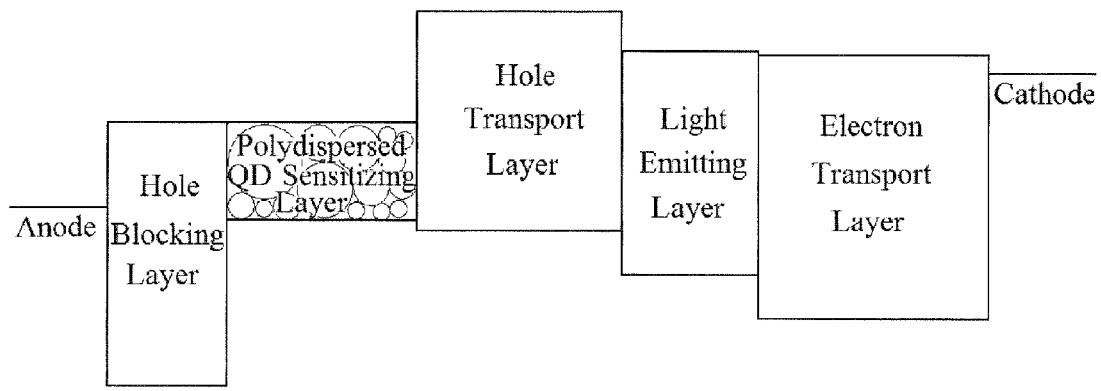
FIG. 6 shows a schematic energy band diagram of an up-conversion device with an IR sensitizing layer of polydispersed quantum dots according to an embodiment of the invention

FIG. 6 is the schematic energy band diagram of an infrared-to-visible light up-conversion device having an IR photodetector that comprises a broad absorption IR sensitizing layer, according to an embodiment of the invention. As shown in FIG. 6, the anode can be, but is not limited to: Indium tin Oxide (ITO), Indium Zinc Oxide (IZO), Aluminum Tin Oxide (ATO), Aluminum Zinc Oxide (AZO) or carbon nanotubes. Electroluminescent light emitting diode (LED) materials that can be employed include, but are not limited to, tris-(2-phenylpyidine) iridium ($Ir(ppy)_3$), poly-[2-methoxy, 5-(2'-ethyl-hexyloxy) phenylene vinylene] (MEH-PPV), tris-(8-hydroxy quinoline) aluminum ($Alq_3$), and iridium (III) bis-[(4,6-di-fluorophenyl)-pyridinate-N,C2']picolinate (FIrpic). The cathode can be LiF/Al or can be any conductor with the appropriate work function including, but not limited to, Ag, Ca, Mg, LiF/Al/ITO, Ag/ITO, $CsCO_3$/ITO and Ba/Al. The device can include a hole transport layer (HTL). Materials that can be employed as a HTL include, but are not limited to, 1,1-bis[(di-4-tolylamino)phenyl]cyclohexane (TAPC), N,N'-diphenyl-N,N'(2-naphthyl)-(1,1'-phenyl)-4,4'-diamine (NPB), and N,N'-diphenyl-N,N'-di(m-tolyl) benzidine (TPD). The device can include an electron transport layer (ETL). Materials that can be employed as an ETL include, but are not limited to, tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), and tris-(8-hydroxy quinoline) aluminum ($Alq_3$). Those skilled in the art can readily identify appropriate combinations of anodes, cathodes, LED materials, optional HTLs, optional HBLs, optional EBLs and optional ETLs that can be employed with the IR sensitizing layer of by their relative work functions, HOMO and LUMO levels, layer compatibility, and the nature of any desired deposition methods used during their fabrication of devices according to embodiments of the invention.

Methods and Materials

Polydispersed PbSe nanocrystals were synthesized using diphenylphosphine (DPP) as a catalyst. In a typical reaction, lead oxide (2 mmol) was dissolved in a mixture of octadecene and oleic acid (6 mmol) with uniform heating and vigorous stirring under an argon atmosphere. When the temperature reached 140° C., 6 mmol of 1M selenium in trioctylphospine and 56 μl of DPP were rapidly injected into the lead comprising solution to initiate the nucleation of nanocrystals. The size of the nanocrystals depends on the reaction composition, reaction temperature, and reaction time. The reaction was terminated by injection of cold toluene to the reaction mixture. The resulting nanocrystals were subsequently isolated by: precipitating with acetone; redispersing the nanocrystals in toluene; and repeating the steps of precipitating and redispersing three times to remove excess unreacted precursors and reaction byproducts.

Subsequently, a ligand exchange reaction was carried out where the bulky oleate ligands were exchanged with shorter-chain octylamine or ethanethiol ligands in a nitrogen glove box over a period of 48 hours, where: after precipitating the nanocrystals in acetone, the nanocrystals were redispersed in 10 ml of octylamine; or, after redispersing the nanocrystals in toluene, an equal volume of ethanethiol was added to the suspension. Subsequently, the ligand exchanged particles were precipitated with acetone and finally redispersed in chloroform at a concentration of about 60 mg/ml. The exchange of oleate passivating groups with octylamine resulted in a clear dispersion with no agglomeration of particles.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. An IR photodetector, comprising: an anode; a hole blocking layer (HBL); an IR sensitizing layer comprising polydispersed quantum dots (QDs); an electron blocking layer (EBL); and a cathode; wherein the IR sensitizing layer absorbs over a broad range including at least a portion of the near infrared (NIR), wherein the IR sensitizing layer physically contacts the HBL and the EBL, and wherein the polydispersed QDs are a monomodal polydispersed QDs, or a polymodal polydispersed QDs.

2. The photodetector of claim 1, wherein the IR sensitizing layer comprises polydispersed PbS QDs and/or polydispersed PbSe QDs.

3. The IR photodetector of claim 1, wherein the cathode comprises Ag, Ca, Mg, Indium tin Oxide (ITO), Indium Zinc Oxide (IZO), Aluminum Tin Oxide (ATO), Aluminum Zinc Oxide (AZO), carbon nanotube, silver nanowire, LiF/Al/ITO, Ag/ITO, or $CsCO_3$/ITO.

4. The IR photodetector of claim 1, wherein the anode comprises Ag, Ca, Mg, Indium tin Oxide (ITO), Indium Zinc Oxide (IZO), Aluminum Tin Oxide (ATO), Aluminum Zinc Oxide (AZO), carbon nanotube, silver nanowire, LiF/Al/ITO, Ag/ITO, and $CsCO_3$/ITO.

5. The IR photodetector of claim 1, wherein the HBL comprises 2,9-Dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline) aluminum ($Alq_3$), 3,5'-N,N'-dicarbazole-benzene (mCP), $C_{60}$, tris[3-(3-pyridyl)-mesityl]borane (3TPYMB), ZnO, or $TiO_2$.

6. The IR photodetector of claim 1, wherein the EBL of claim 1 comprises 1,1-bis [(di-4-tolylamino) phenyl] cyclohexane (TAPC), N,N'-diphenyl-N,N'(2-naphthyl)-(1,1'-phenyl)-4,4'-diamine (NPB), and N,N'-diphenyl-N,N'-di(m-tolyl) benzidine (TPD).

7. An up-conversion device, comprising: an anode, a hole blocking layer (HBL); an IR sensitizing layer comprising polydispersed quantum dots (ODs); a light emitting diode (LED) layer; and a cathode.

8. The up-conversion device of claim 7, wherein the IR sensitizing layer comprises polydispersed PbS QDs and/or polydispersed PbSe QDs.

9. The up-conversion device of claim 7, wherein the light emitting layer comprises tris-(2-phenylpyidine) iridium (Ir(ppy)$_3$), poly-[2-methoxy, 5-(2'-ethyl-hexyloxy) phenylene vinylene] (MEH-PPV), tris-(8-hydroxy quinoline) aluminum (Alq$_3$), or iridium (III) bis-[(4,6-di-fluorophenyl)-pyridinate-N,C2']picolinate (FIrpic).

10. The up-conversion device of claim 7, wherein the LED layer further comprises an electron transport layer (ETL) and/or a hole transport layer (HTL).

11. The up-conversion device of claim 10, wherein the ETL comprises tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), or tris-(8-hydroxy quinoline) aluminum (Alq$_3$).

12. The up-conversion device of claim 10, wherein the HTL comprises 1,1-bis[(di-4-tolylamino)phenyl]cyclohexane (TAPC), N,N'-diphenyl-N,N'(2-naphthyl)-(1,1'-phenyl)-4,4'-diamine (NPB), or N,N'-diphenyl-N,N'-di(m-tolyl) benzidine (TPD).

13. The up-conversion device of claim 7, wherein the cathode comprises Ag, Ca, Mg, Indium tin Oxide (ITO), Indium Zinc Oxide (IZO), Aluminum Tin Oxide (ATO), Aluminum Zinc Oxide (AZO), carbon nanotube, silver nanowire, LiF/Al/ITO, Ag/ITO, or CsCO3/ITO.

14. The up-conversion device of claim 7, wherein the anode comprises Ag, Ca, Mg, Indium tin Oxide (ITO), Indium Zinc Oxide (IZO), Aluminum Tin Oxide (ATO), Aluminum Zinc Oxide (AZO), carbon nanotube, silver nanowire, LiF/Al/ITO, Ag/ITO, and CsCO3/ITO.

15. The up-conversion device of claim 7, wherein the HBL comprises 2,9-Dimethyl-4,7-diphenyl-1,10-phenanthroline (BCP), p-bis(triphenylsilyl)benzene (UGH2), 4,7-diphenyl-1,10-phenanthroline (BPhen), tris-(8-hydroxy quinoline) aluminum (Alq$_3$), 3,5'-N,N'-dicarbazole-benzene (mCP), C$_{60}$, tris[3-(3-pyridyl)-mesityl]borane (3TPYMB), ZnO, or TiO$_2$.

* * * * *